US010658254B2

(12) United States Patent
Yoshimatsu et al.

(10) Patent No.: US 10,658,254 B2
(45) Date of Patent: May 19, 2020

(54) SEMICONDUCTOR DEVICE AND MANUFACTURING METHOD THEREOF

(71) Applicant: Mitsubishi Electric Corporation, Tokyo (JP)

(72) Inventors: Naoki Yoshimatsu, Tokyo (JP); Osamu Usui, Tokyo (JP); Yuji Imoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/319,975

(22) PCT Filed: Oct. 24, 2016

(86) PCT No.: PCT/JP2016/081492
§ 371 (c)(1),
(2) Date: Jan. 23, 2019

(87) PCT Pub. No.: WO2018/078705
PCT Pub. Date: May 3, 2018

(65) Prior Publication Data
US 2019/0267297 A1    Aug. 29, 2019

(51) Int. Cl.
*H01L 23/057* (2006.01)
*H01L 21/48* (2006.01)
(Continued)

(52) U.S. Cl.
CPC ........ *H01L 23/057* (2013.01); *H01L 21/4817* (2013.01); *H01L 21/4853* (2013.01);
(Continued)

(58) Field of Classification Search
CPC ....... H01L 23/057; H01L 23/28; H01L 23/48; H01L 21/4817; H01L 21/4853;
(Continued)

(56) References Cited

U.S. PATENT DOCUMENTS 6,034,383 A * 3/2000 Bayraktaroglu .... H01L 29/0692
257/197
2007/0004092 A1 1/2007 Suzuki et al.
(Continued)

FOREIGN PATENT DOCUMENTS

JP   2006-190728 A   7/2006
JP   2006-202885 A   8/2006
(Continued)

OTHER PUBLICATIONS

International Search Report; Written Opinion; and Notification of Transmittal of the International Search Report and the Written Opinion of the International Searching Authority, or the Declaration issued in PCT/JP2016/081492; dated Dec. 27, 2016.

*Primary Examiner* — Yasser A Abdelaziez
(74) *Attorney, Agent, or Firm* — Studebaker & Brackett PC

(57) ABSTRACT

First and second electrodes (12,13) are provided on an upper surface of the semiconductor chip (9) and spaced apart from each other. A wiring member (15) includes a first joint (15*a*) bonded to the first electrode (12) and a second joint (15*b*) bonded to the second electrode (13). Resin (2) seals the semiconductor chip (9), the first and second electrodes (12,13) and the wiring member (15). A hole (18) extending through the wiring member (15) up and down is provided between the first joint (15*a*) and the second joint (15*b*).

7 Claims, 8 Drawing Sheets

(51) Int. Cl.
*H01L 21/56* (2006.01)
*H01L 23/31* (2006.01)
*H01L 23/498* (2006.01)
*H01L 23/28* (2006.01)
*H01L 23/48* (2006.01)

(52) U.S. Cl.
CPC ............ *H01L 21/565* (2013.01); *H01L 23/28* (2013.01); *H01L 23/3121* (2013.01); *H01L 23/48* (2013.01); *H01L 23/49844* (2013.01)

(58) Field of Classification Search
CPC ................ H01L 21/565; H01L 23/3121; H01L 23/49844; H01L 23/528; H01L 23/315; H01L 23/481
See application file for complete search history.

(56) References Cited

U.S. PATENT DOCUMENTS

| | | | |
|---|---|---|---|
| 2007/0205432 A1* | 9/2007 | Tsukao | H01L 29/41708 257/183 |
| 2014/0008782 A1* | 1/2014 | Nishi | H01L 23/34 257/692 |
| 2015/0035138 A1* | 2/2015 | Miyamoto | H01L 23/16 257/712 |
| 2018/0190556 A1* | 7/2018 | Male | H01L 23/315 |

FOREIGN PATENT DOCUMENTS

| | | |
|---|---|---|
| JP | 2013-179229 A | 9/2013 |
| JP | 2014-017318 A | 1/2014 |
| JP | 2014-086501 A | 5/2014 |
| WO | 2005/024933 A1 | 3/2005 |

* cited by examiner

SEMICONDUCTOR DEVICE AND MANUFACTURING METHOD THEREOF

FIELD

The present invention relates to a semiconductor device and a manufacturing method thereof.

BACKGROUND

Semiconductor devices are used in inverters or regenerative converters that control motors of electric cars, trains and the like. Emitter electrodes on upper surfaces of semiconductor chips are bonded to wiring members with solder in semiconductor devices (see, for example, PTL 1).

CITATION LIST

Patent Literature

[PTL 1] Japanese Patent Application Laid-open No. 2014-86501

SUMMARY

Technical Problem

Emitter electrodes may sometimes be split into several groups because of the wiring for temperature sensors or gates on the upper surfaces of semiconductor chips. There may accordingly be a plurality of joints between the several groups of emitter electrodes and wiring members. Joints closely adjoining each other form tunnels therebetween, where air is entrapped when resin flows into the tunnels from both open ends during the resin sealing, resulting in air bubbles. Such air bubbles caused the problem of decreased reliability and insulation properties.

While it would be possible, as a countermeasure, to inject the resin in a low-pressure atmosphere, or, to heat the resin and the product to lower the resin viscosity so that the resin could more readily reach intricate parts, this would lead to the problem of increased facility cost and processing cost.

The present invention was made to solve the problem described above and it is an object of the invention to provide a semiconductor device that can reduce creation of air bubbles in resin at low cost, and a manufacturing method thereof.

Solution to Problem

A semiconductor device according to the present invention includes: a semiconductor chip; first and second electrodes provided on an upper surface of the semiconductor chip and spaced apart from each other; a wiring member including a first joint bonded to the first electrode and a second joint bonded to the second electrode; and resin sealing the semiconductor chip, the first and second electrodes and the wiring member, wherein a hole extending through the wiring member up and down is provided between the first joint and the second joint.

Advantageous Effects of Invention

In the present invention, the air between the first and second joints escapes upward through the hole in the wiring member during the resin sealing. Thus creation of air bubbles in the resin can be suppressed at low cost.

DESCRIPTION OF EMBODIMENTS

A semiconductor device and a manufacturing method thereof according to the embodiments of the present invention will be described with reference to the drawings. The same components will be denoted by the same symbols, and the repeated description thereof may be omitted.

Embodiment 1

Figure 1:
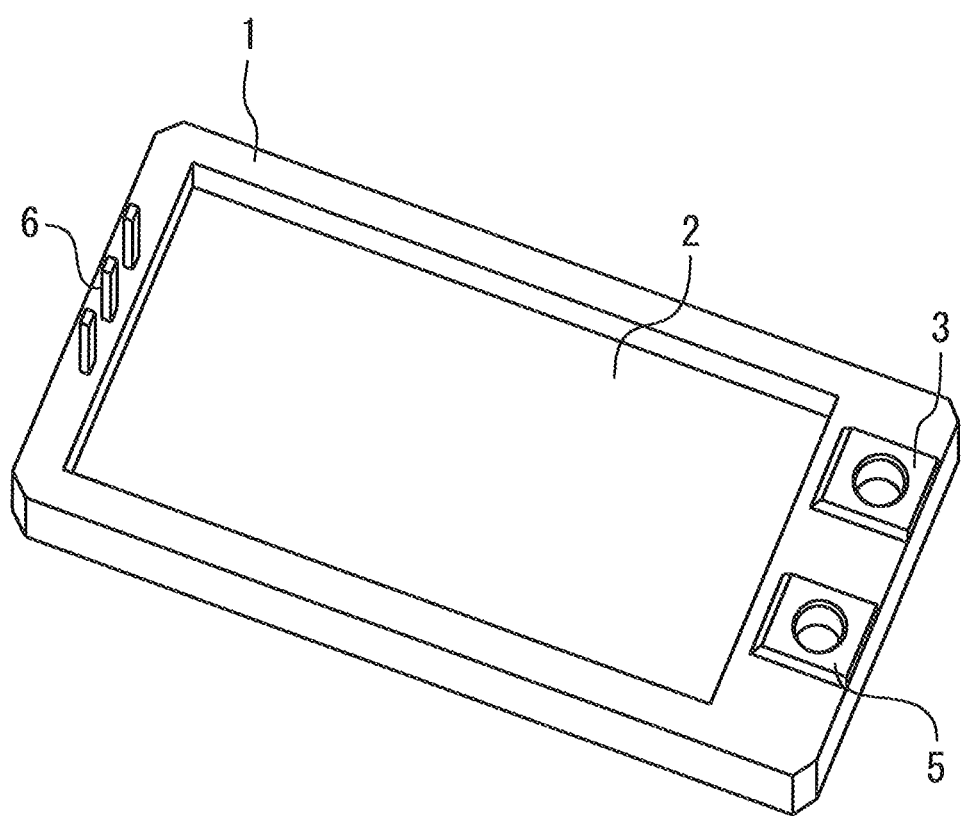
FIG. 1 is a perspective view illustrating a semiconductor device according to Embodiment 1 of the present invention.

FIG. 1 is a perspective view illustrating a semiconductor device according to Embodiment 1 of the present invention. The inside of a case 1 is sealed with resin 2. The case 1 has a structure that prevents spilling of the resin 2. The case 1 is provided with a collector output part 3, an emitter output part 5, and a signal terminal 6.

Figure 2:
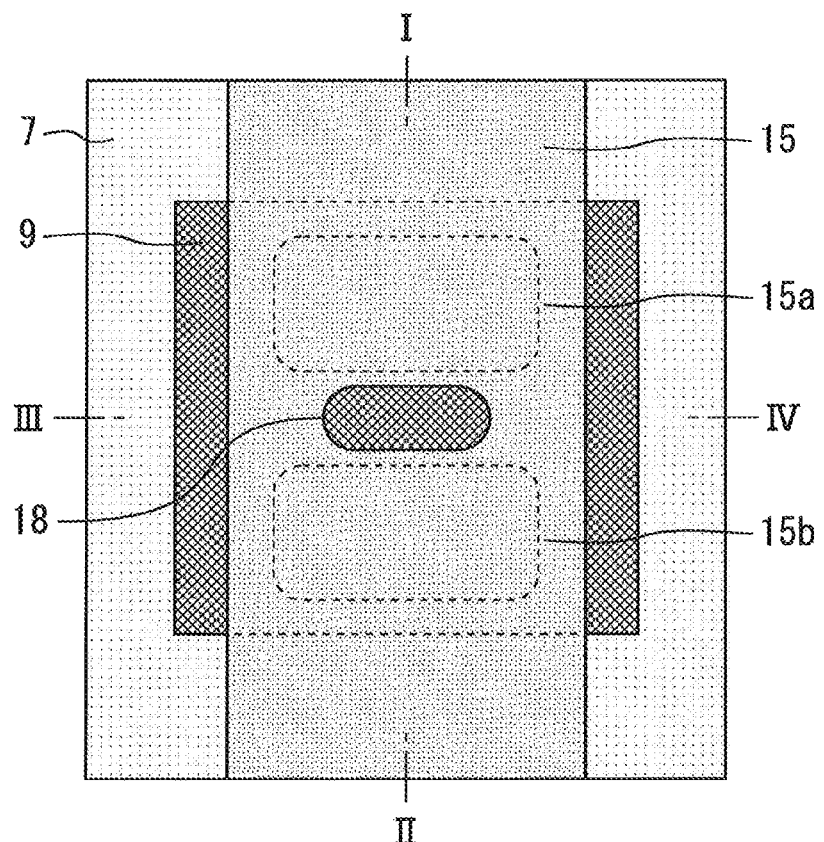
FIG. 2 is a plan view illustrating major parts of the semiconductor device according to Embodiment 1 of the present invention.
Figure 3:
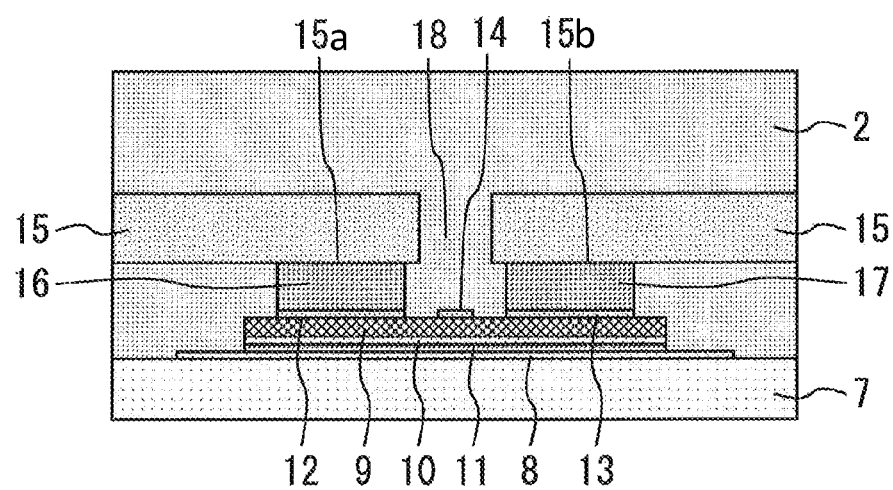
FIG. 3 is a cross-sectional view along I-II of FIG. 2.
Figure 4:
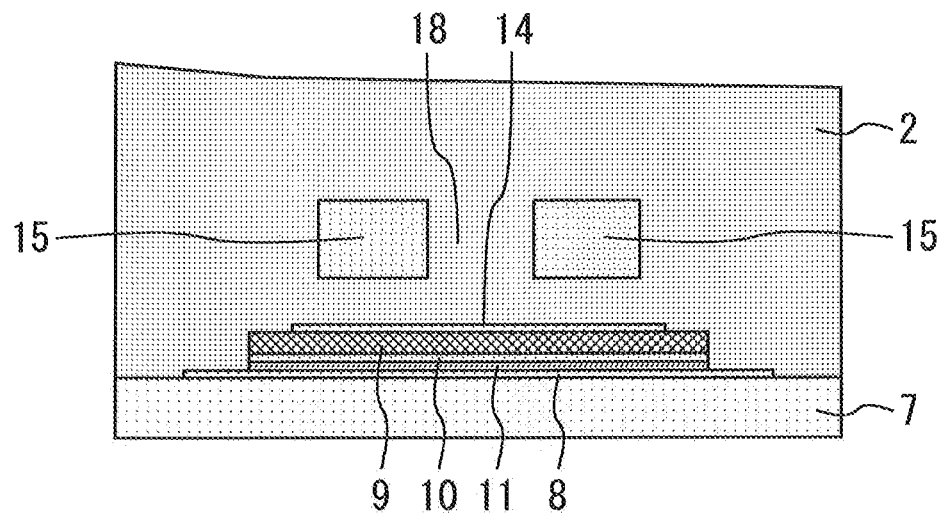
FIG. 4 is a cross-sectional view along III-IV of FIG. 2.

FIG. 2 is a plan view illustrating major parts of the semiconductor device according to Embodiment 1 of the present invention. FIG. 3 is a cross-sectional view along I-II of FIG. 2. FIG. 4 is a cross-sectional view along III-IV of FIG. 2.

A substrate 7 is bonded to the bottom surface of the case 1. An electrode 8 of the substrate 7 is connected to the collector output part 3. A collector electrode 10 on the underside of a semiconductor chip 9 is bonded to the electrode 8 of the substrate 7 with solder 11. The semiconductor chip 9 is an IGBT, but may be a MOSFET, SBD, PN diode, or the like.

First and second emitter electrodes 12 and 13 spaced apart from each other are provided on an upper surface of the semiconductor chip 9. Wiring 14 that is not connected to the first and second emitter electrodes 12 and 13 is provided on the upper surface of the semiconductor chip 9 between the first emitter electrode 12 and the second emitter electrode 13. The wiring 14 is connected to a temperature sensor, a gate or the like. The emitter electrode is separated to the first and second emitter electrodes 12 and 13 because of this wiring 14. The wiring 14 is connected to the signal terminal 6 with an aluminum wire or the like (not shown). Therefore, input signals are input to the gate of the semiconductor chip 9, or, temperature output signals are output from the semiconductor chip 9, via the signal terminal 6 and wiring 14.

A first joint 15a of a wiring member 15 is bonded to the first emitter electrode 12 with solder 16. A second joint 15b of the wiring member 15 is bonded to the second emitter electrode 13 with solder 17. The wiring member 15 is connected to the emitter output part 5.

The resin 2 seals the semiconductor chip 9, first and second emitter electrodes 12 and 13, wiring member 15, and so on. A hole 18 extending through the wiring member 15 up and down is provided between the first joint 15a and the second joint 15b.

Figure 5:
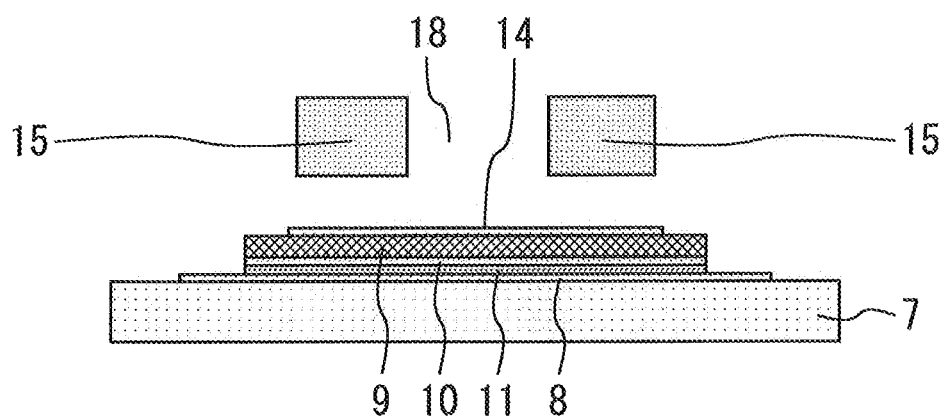
FIG. 5 is a cross-sectional view illustrating the manufacturing process step of the semiconductor device according to Embodiment 1 of the present invention.
Figure 6:
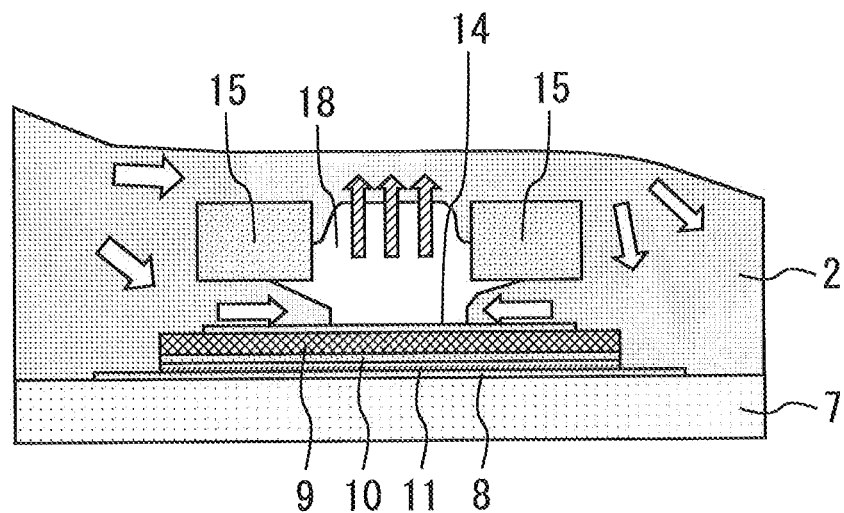
FIG. 6 is a cross-sectional view illustrating the manufacturing process step of the semiconductor device according to Embodiment 1 of the present invention.

Next, a manufacturing method of the semiconductor device according to this embodiment will be described. FIG. 5 and FIG. 6 are cross-sectional views illustrating the manufacturing process steps of the semiconductor device according to Embodiment 1 of the present invention. FIG. 5 and FIG. 6 correspond to the cross-sectional view of FIG. 4.

First, the hole 18 is formed between the first joint 15a and the second joint 15b of the wiring member 15 such as to extend through the wiring member 15 up and down. Next, the first and second emitter electrodes 12 and 13 provided on the upper surface of the semiconductor chip 9 and spaced apart from each other are respectively bonded to the first and second joints 15a and 15b of the wiring member 15. This brings the device into the state shown in FIG. 5 before sealed with resin. Next, when the resin 2 is injected from sides of the wiring member 15 as shown in FIG. 6, the air inside the tunnel between the first and second joints 15a and 15b escapes upward through the hole 18 in the wiring member 15.

Figure 7:
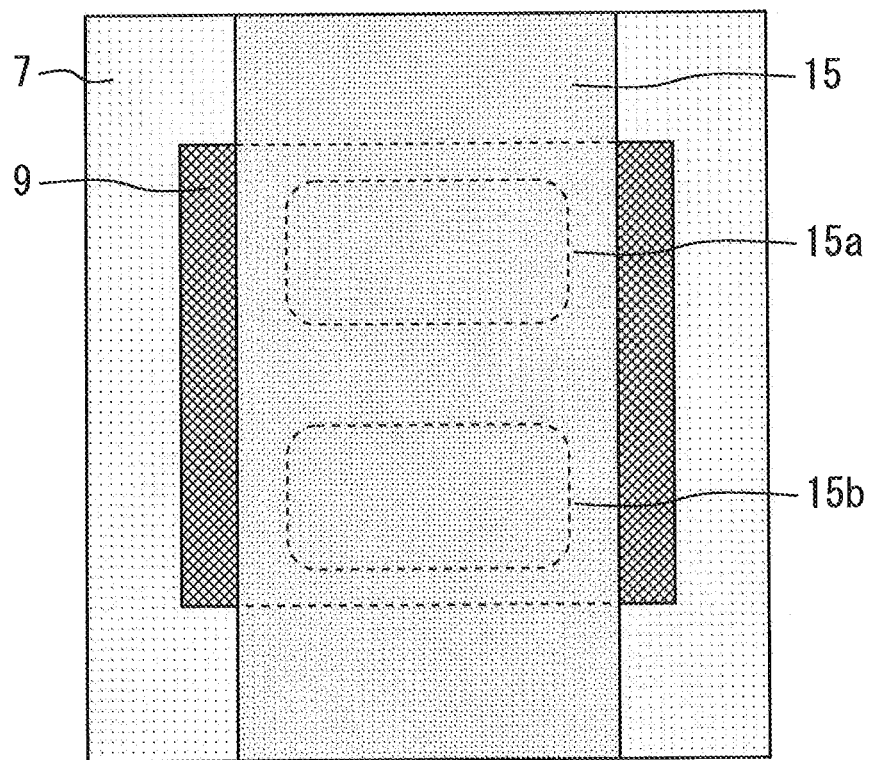
FIG. 7 is a plan view illustrating major parts of a semiconductor device according to the comparative example.
Figure 8:
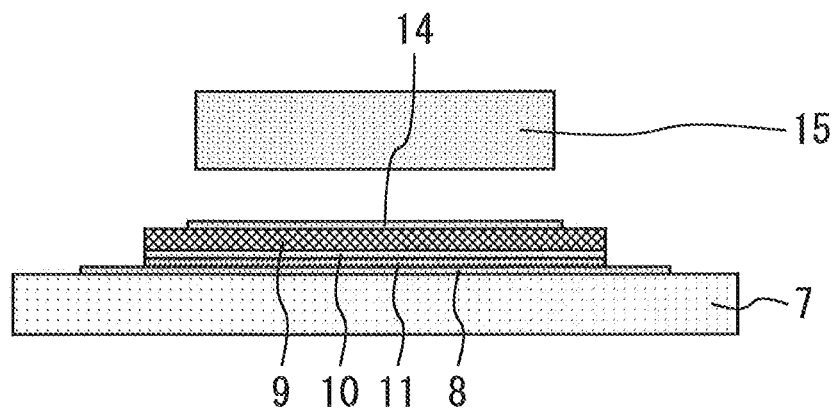
FIG. 8 is a cross-sectional view illustrating the manufacturing process step of the semiconductor device according to the comparative example.
Figure 9:
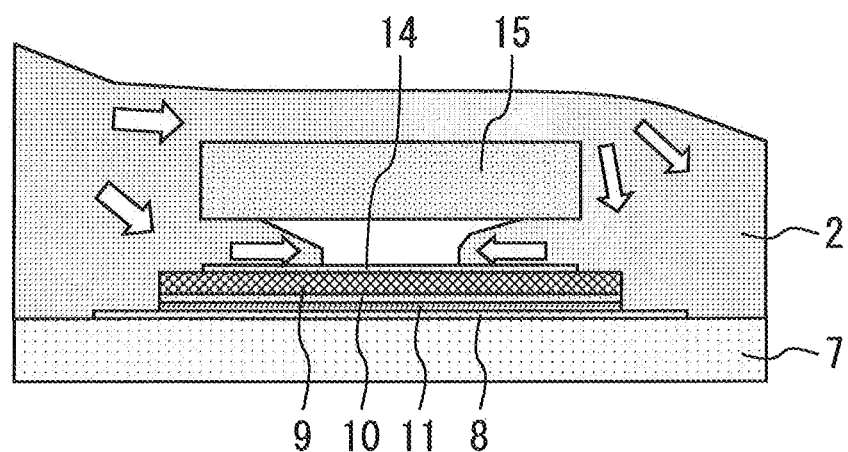
FIG. 9 is a cross-sectional view illustrating the manufacturing process step of the semiconductor device according to the comparative example.
Figure 10:
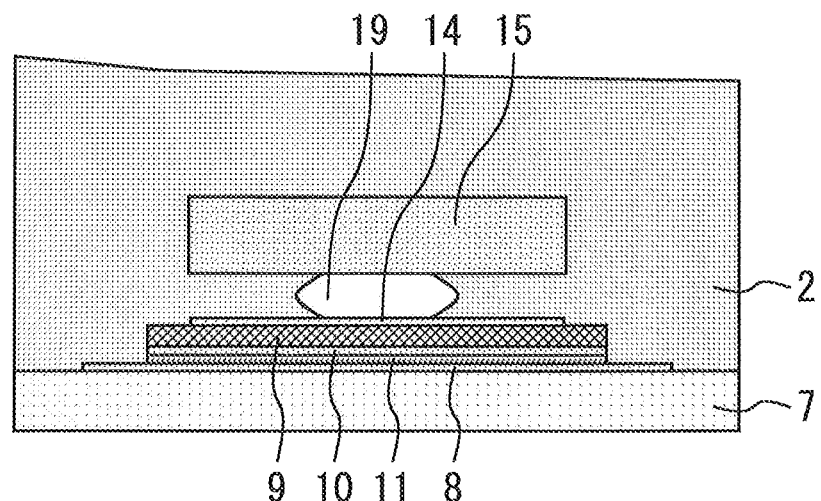
FIG. 10 is a cross-sectional view illustrating the manufacturing process step of the semiconductor device according to the comparative example.

The effects of this embodiment will now be described in comparison to a comparative example. FIG. 7 is a plan view illustrating major parts of a semiconductor device according to the comparative example. The hole 18 is not formed in the wiring member 15 in the comparative example. FIG. 8 to FIG. 10 are cross-sectional views illustrating the manufacturing process steps of the semiconductor device according to the comparative example. FIG. 8 to FIG. 10 correspond to the cross-sectional view of FIG. 4. FIG. 8 shows the state before the resin sealing.

Generally, the resin 2 has high viscosity and poor flowability even before it starts to harden. Therefore, when the resin 2 is injected from sides of the wiring member 15, the resin flows faster on the wiring member 15 than in the gap below the wiring member 15, as shown in FIG. 9. This leads to air entrapment below the wiring member 15 due to the resin 2 flowing into the tunnel between the first and second joints 15a and 15b from both open ends, resulting in an air bubble 19. Such an air bubble decreases reliability as well as insulating properties.

In contrast, the air between the first and second joints 15a and 15b escapes upward through the hole 18 in the wiring member 15 during the resin sealing in this embodiment. Thus creation of air bubbles in the resin 2 can be minimized at low cost. The hole 18 may be an oblong hole extending along the tunnel between the first and second joints 15a and 15b to make it even easier for the air to escape.

Embodiment 2

Figure 11:
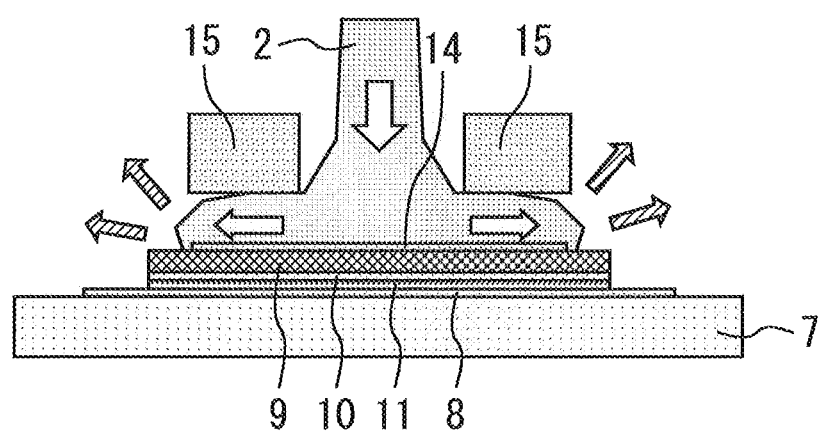
FIG. 11 is a cross-sectional view illustrating a manufacturing process step of a semiconductor device according to Embodiment 2 of the present invention.

FIG. 11 is a cross-sectional view illustrating a manufacturing process step of a semiconductor device according to Embodiment 2 of the present invention. In this embodiment, the resin 2 is injected downward of the wiring member 15 through the hole 18 to seal the semiconductor chip 9, first and second emitter electrodes 12 and 13, and wiring member 15. Other process steps are the same as those of Embodiment 1. The air below the wiring member 15 is pushed out by the resin 2 so that creation of air bubbles in the resin 2 can be suppressed.

Embodiment 3

Figure 12:
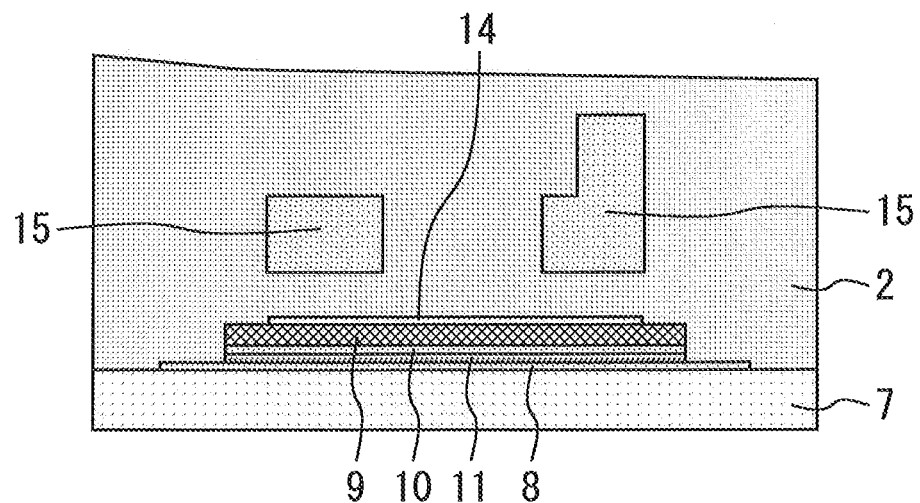
FIG. 12 is a cross-sectional view illustrating major parts of a semiconductor device according to Embodiment 3 of the present invention.

FIG. 12 is a cross-sectional view illustrating major parts of a semiconductor device according to Embodiment 3 of the present invention. In this embodiment, one side in the width direction of the wiring member 15 is bent upward.

Figure 13:
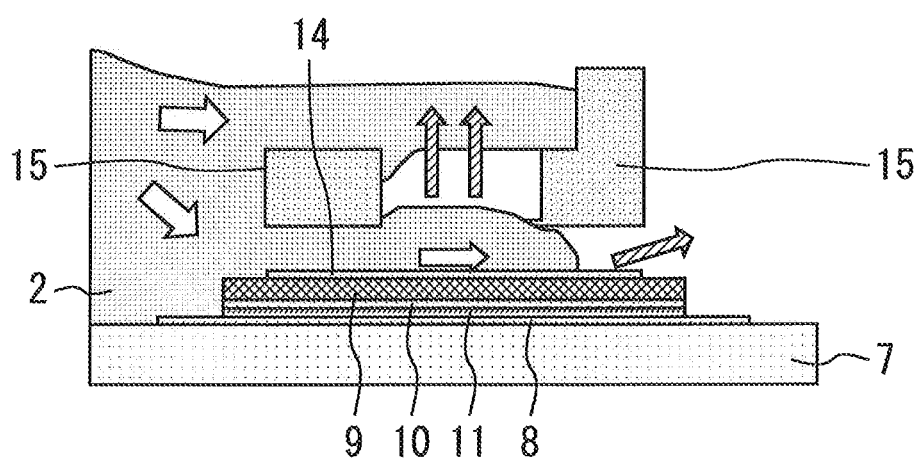
FIG. 13 is a cross-sectional view illustrating a manufacturing process step of the semiconductor device according to Embodiment 3 of the present invention.

FIG. 13 is a cross-sectional view illustrating a manufacturing process step of the semiconductor device according to Embodiment 3 of the present invention. The bent portion of the wiring member 15 acts as a dam and temporarily stops the resin 2 flowing on the wiring member 15. This delays the resin 2 flowing over and around the wiring member. In the meantime the resin 2 flows into the tunnel below the wiring member 15 from one side and pushes out the air, which can reduce creation of air bubbles in the resin 2. The same effects can be achieved even if the wiring member 15 does not have the hole 18.

Embodiment 4

Figure 14:
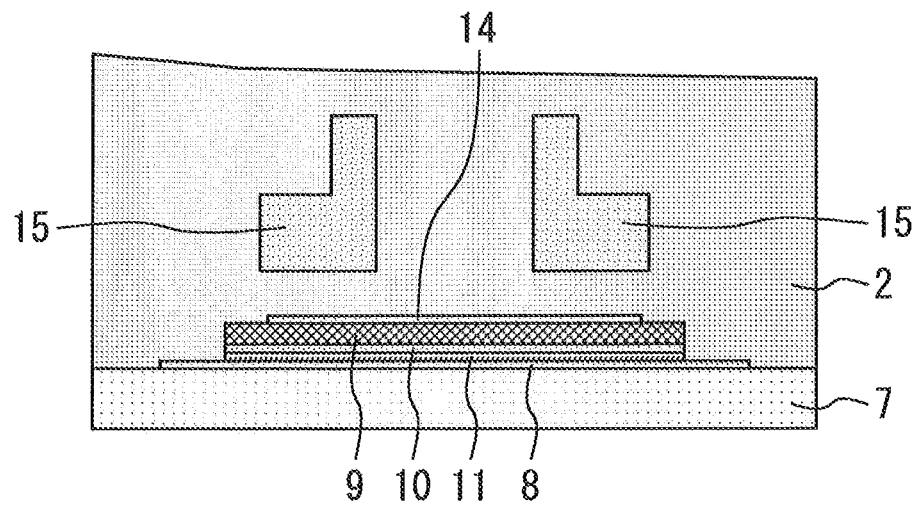
FIG. 14 is a cross-sectional view illustrating major parts of a semiconductor device according to Embodiment 4 of the present invention.

FIG. 14 is a cross-sectional view illustrating major parts of a semiconductor device according to Embodiment 4 of the present invention. In this embodiment, the wiring member 15 protrudes upward around the hole 18 in a chimney-like fashion.

Figure 15:
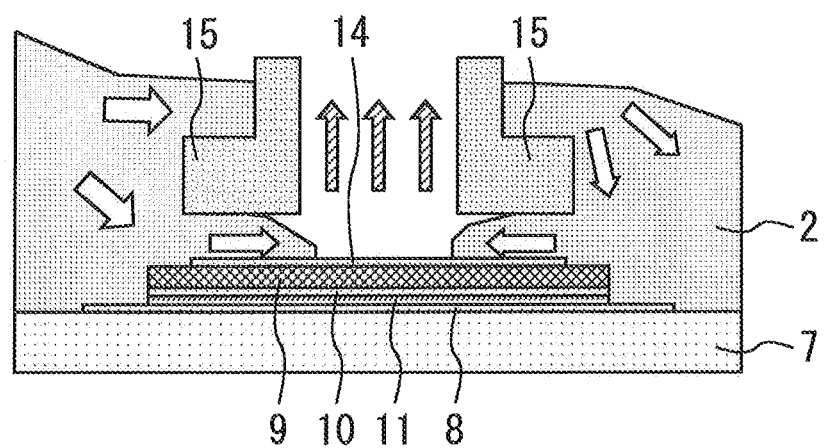
FIG. 15 is a cross-sectional view illustrating a manufacturing process step of the semiconductor device according to Embodiment 4 of the present invention.

FIG. 15 is a cross-sectional view illustrating a manufacturing process step of the semiconductor device according to Embodiment 4 of the present invention. The resin 2 flowing on the wiring member 15 can hardly flow over the hole 18 because of the chimney-like, upwardly protruding portion. The air can thus readily escape through the hole 18 and thus creation of air bubbles in the resin 2 can be minimized.

The semiconductor chip 9 is not limited to a semiconductor chip formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor chip formed of such a wide-bandgap semiconductor has a high voltage resistance and a high allowable current density, and thus can be miniaturized. The use of such a miniaturized semiconductor chip enables the miniaturization and high integration of the semiconductor device in which the semiconductor chip is incorporated.

Further, since the semiconductor chip has a high heat resistance, a radiation fin of a heatsink can be miniaturized and a water-cooled part can be air-cooled, which leads to further miniaturization of the semiconductor device. Further, since the semiconductor chip has a low power loss and a high efficiency, a highly efficient semiconductor device can be achieved.

REFERENCE SIGNS LIST 2 resin; 9 semiconductor chip; 12 first emitter electrode; 13 second emitter electrode; 14 wiring; 15 wiring member; 15a first joint; 15b second joint; 18 hole

The invention claimed is:

1. A semiconductor device comprising:
    a semiconductor chip;
    first and second electrodes provided on an upper surface of the semiconductor chip and spaced apart from each other;
    a wiring member including a first joint bonded to the first electrode and a second joint bonded to the second electrode; and
    resin sealing the semiconductor chip, the first and second electrodes and the wiring member,
    wherein a hole extending through the wiring member up and down is provided between the first joint and the second joint.

2. The semiconductor device according to claim 1, further comprising wiring provided on the upper surface of the semiconductor chip between the first electrode and the second electrode and not connected to the first and second electrodes.

3. The semiconductor device according to claim 1, wherein the hole is an oblong hole.

4. The semiconductor device according to claim 1, wherein one side in a width direction of the wiring member is bent upward.

5. The semiconductor device according to claim 1, wherein the wiring member protrudes upward around the hole in a chimney-like fashion.

6. The semiconductor device according to claim 1, wherein the semiconductor chip is made of a wide-band-gap semiconductor.

7. A manufacturing method of a semiconductor device comprising:
    forming a hole extending through a wiring member up and down between a first joint and a second joint of the wiring member;
    bonding first and second electrodes, which are provided on an upper surface of a semiconductor chip and spaced apart from each other, to the first and second joints of the wiring member respectively; and
    injecting resin downward of the wiring member through the hole to seal the semiconductor chip, the first and second emitter electrodes, and the wiring member.

* * * * *